(12) United States Patent
Li et al.

(10) Patent No.: US 8,981,534 B2
(45) Date of Patent: Mar. 17, 2015

(54) PRE-CUTTING A BACK SIDE OF A SILICON SUBSTRATE FOR GROWING BETTER III-V GROUP COMPOUND LAYER ON A FRONT SIDE OF THE SUBSTRATE

(75) Inventors: Zhen-Yu Li, Chiayi County (TW); Chung-Pao Lin, New Taipei (TW); Hsing-Kuo Hsia, Hsin Chu County (TW); Hao-Chung Kuo, Hsin-Tsu County (TW); Cindy Huichun Shu, Hsinchu (TW); Hsin-Chieh Huang, Hsin-Chu (TW)

(73) Assignee: TSMC Solid State Lighting Ltd., Hsinchu (TW)

( * ) Notice: Subject to any disclaimer, the term of this patent is extended or adjusted under 35 U.S.C. 154(b) by 0 days.

(21) Appl. No.: 13/616,415

(22) Filed: Sep. 14, 2012

(65) Prior Publication Data

US 2014/0077224 A1 Mar. 20, 2014

(51) Int. Cl.
*H01L 29/06* (2006.01)
(52) U.S. Cl.
USPC .............................. 257/622; 257/98; 438/478
(58) Field of Classification Search
USPC .................................................. 257/98, 622
See application file for complete search history.

(56) References Cited

U.S. PATENT DOCUMENTS

| 2006/0091500 | A1* | 5/2006 | Lee et al. ........................ 257/615 |
| 2006/0157717 | A1* | 7/2006 | Nagai et al. ...................... 257/81 |
| 2011/0198637 | A1 | 8/2011 | Huang |
| 2013/0140592 | A1* | 6/2013 | Lee et al. ........................ 257/98 |

OTHER PUBLICATIONS

U.S. Patent Office, unpublished U.S. Appl. No. 13/398,954, filed Feb. 17, 2012 and titled "Method of Growing a High-Quality III-V Compound Layer on a Silicon Substrate," 30 pages.
Wang, C. H., et al, Efficiency droop alleviation in InGaN/GaN light-emitting diodes by graded-thickness multiple quantum wells, Appl. Phys. Lett. 97, 181101 (2010); doi: 10.1063/1.3507891, 4 pages.

* cited by examiner

*Primary Examiner* — Thao X Le
*Assistant Examiner* — Laura Dykes
(74) *Attorney, Agent, or Firm* — Haynes and Boone, LLP

(57) ABSTRACT

The present disclosure involves an apparatus. The apparatus includes a substrate having a front side a back side opposite the front side. The substrate includes a plurality of openings formed from the back side of the substrate. The openings collectively define a pattern on the back side of the substrate from a planar view. In some embodiments, the substrate is a silicon substrate or a silicon carbide substrate. Portions of the silicon substrate vertically aligned with the openings have vertical dimensions that vary from about 100 microns to about 300 microns. A III-V group compound layer is formed over the front side of the silicon substrate. The III-V group compound layer is a component of one of: a light-emitting diode (LED), a laser diode (LD), and a high-electron mobility transistor (HEMT).

20 Claims, 16 Drawing Sheets

_US 8,981,534 B2_

PRE-CUTTING A BACK SIDE OF A SILICON SUBSTRATE FOR GROWING BETTER III-V GROUP COMPOUND LAYER ON A FRONT SIDE OF THE SUBSTRATE

TECHNICAL FIELD

The present disclosure relates generally to III-V group compound devices, and more particularly, to improving the growth of III-V group compound layers on a substrate.

BACKGROUND

The semiconductor industry has experienced rapid growth in recent years. Technological advances in semiconductor materials and design have produced various types of devices that serve different purposes. The fabrication of some types of these devices may require forming one or more III-V group compound layer on a substrate, for example forming a gallium nitride layer on a substrate. Devices using III-V group compounds may include light-emitting diode (LED) devices, laser diode (LD) devices, radio frequency (RF) devices, high electron mobility transistor (HEMT) devices, and/or high power semiconductor devices.

Traditionally, manufacturers have formed the III-V group compound layer on a sapphire substrate. However, sapphire substrates are expensive. Thus, some manufacturers have been attempting to form III-V group compound layers on a silicon substrate, which is cheaper. However, due to lattice constant mismatches and the different thermal expansion coefficients between the III-V group compound layer and the silicon substrate, existing methods of forming a III-V group compound layer on a silicon substrate may result in wafer defects (e.g., cracking defects) or yield low quality III-V group compound layers.

Therefore, while existing methods of forming III-V group compound layers on silicon substrates have been generally adequate for their intended purposes, they have not been entirely satisfactory in every aspect. A method of growing high quality III-V group compound layers on a silicon layer without defects such as cracking continues to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
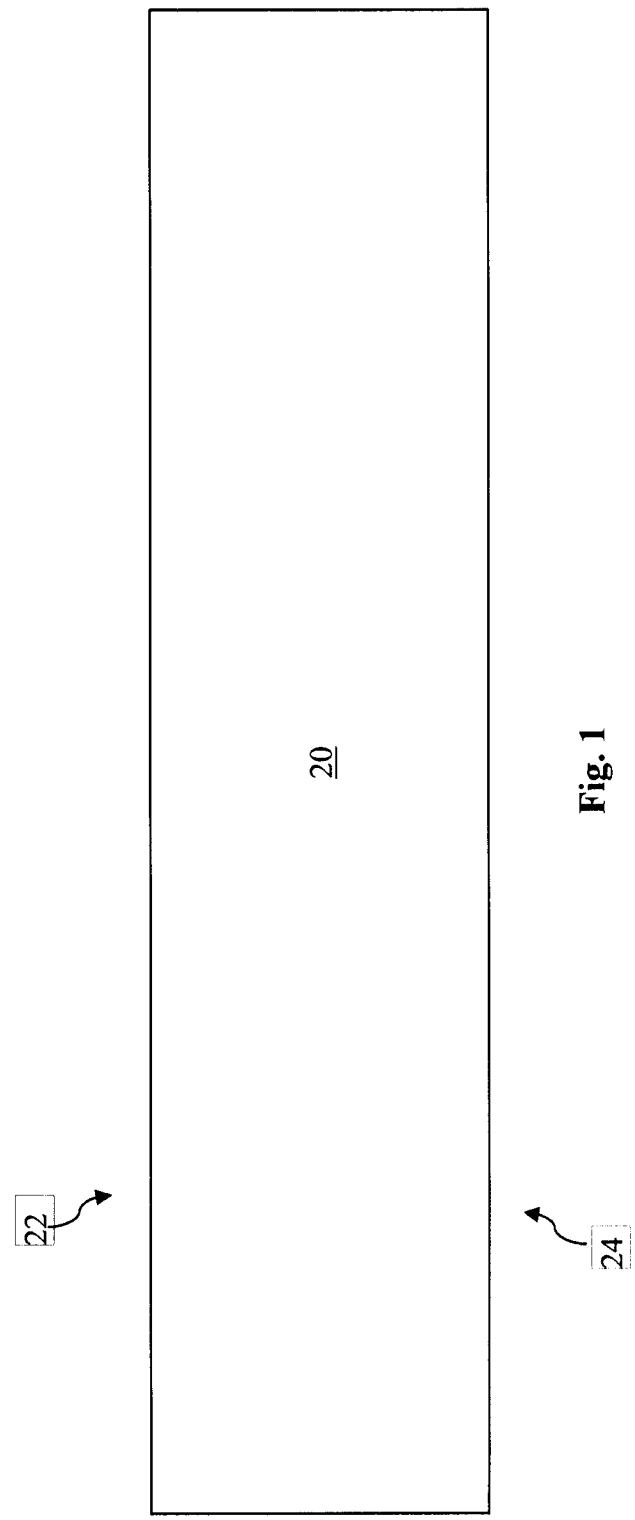
FIGS. 1-2 are diagrammatic fragmentary cross cross-sectional side views of an example substrate processed according to various aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the terms "top," "bottom," "under," "over," and the like are used for convenience and are not meant to limit the scope of embodiments to any particular orientation. Various features may also be arbitrarily drawn in different scales for the sake of simplicity and clarity. In addition, the present disclosure may repeat reference numerals and/or letters in the various examples. This repetition is for the purpose of simplicity and clarity and does not in itself necessarily dictate a relationship between the various embodiments and/or configurations discussed.

As semiconductor fabrication technologies continue to advance, III-V group compound materials have been utilized to produce a variety of devices, such as light-emitting diode (LED) devices, radio frequency (RF) devices, high electron mobility transistor (HEMT) devices, and high power semiconductor devices. A III-V group compound material includes a compound that contains an element from a "III" group (or family) of the periodic table, and another element from a "V" group (or family) of the periodic table. For example, the III group elements may include Boron, Aluminum, Gallium, Indium, and Titanium, and the V group elements may include Nitrogen, Phosphorous, Arsenic, Antimony, and Bismuth.

Traditionally, III-V group compound materials have been grown on sapphire substrates. However, sapphire substrates are expensive. In comparison, silicon substrates are cheaper and have been used as the substrate on which semiconductor devices are formed for many years. Hence, it is desirable to use silicon substrates as the substrates for growing III-V group compound materials. Unfortunately, a significant lattice mismatch exists between a III-V group compound materials and a silicon substrate. In addition, the III-V group compound materials and the silicon substrate also have different coefficients of thermal expansion (CTE). Due at least in part to the lattice mismatch and the different CTEs, stress or strain will result between the silicon substrate and a III-V group compound layer formed thereon. Such stress or strain can lead to difficulty of growth of the III-V group compound layer and/or cracks during fabrication. Some existing methods attempt to resolve these issues have either not been able to adequately prevent the defects such as cracks, and/or may lead to a degradation of the quality of the III-V group compound material that is grown on the silicon substrate.

According to various aspects of the present disclosure, described below is a method of forming a high quality III-V group compound layer on a substrate with substantial defect reduction.

Referring to FIG. 1, a diagrammatic fragmentary cross-sectional side view of a substrate 20 is illustrated. In the present embodiments, the substrate 20 is a silicon substrate. In other embodiments, the substrate 20 may be a silicon carbide substrate, a gallium arsenide substrate, or a composite substrate. For the discussions below, the substrate 20 is referred to as a silicon substrate 20, though it is understood that the concepts of the present disclosure may apply to the silicon carbide substrate, the gallium arsenide substrate, or the composite substrate as well.

The silicon substrate 20 is a portion of a wafer. Silicon wafers have been used for semiconductor fabrication for many years and are inexpensive. Therefore, it is desirable to be able to grow III-V group compound layers on a silicon wafer. As shown in FIG. 1, the silicon substrate 20 has a front side (or front surface) 22 and a back side 24 (or back surface). The III-V group compound layer (and other layers) will be formed over the front side 22 of the silicon substrate 20, for example through an epitaxial growth process.

Figure 2:
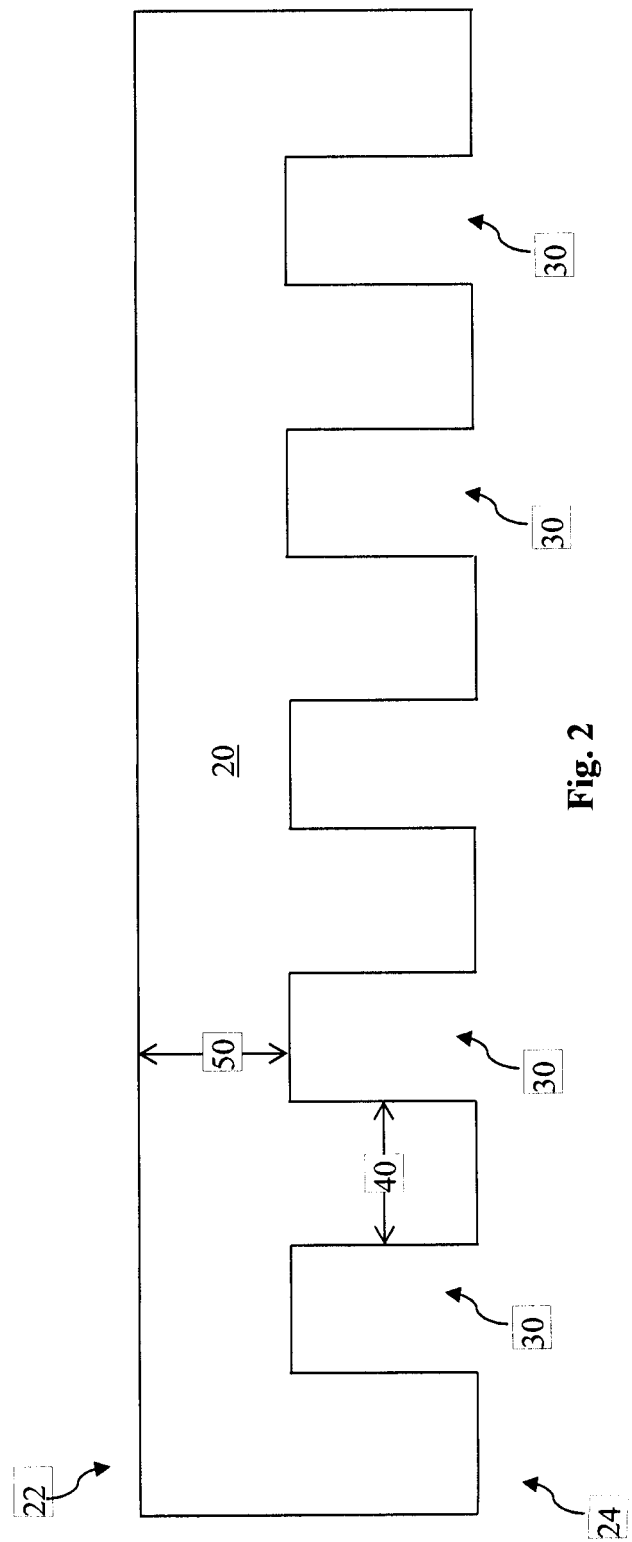

Referring now to FIG. 2, the back side 24 of the silicon substrate 20 undergoes processing before the III-V group compound layer is epitaxially grown on the front side 22 of the silicon substrate 20. In various embodiments, the back side processing of the silicon substrate 20 includes forming a plurality of recesses (also referred to as openings or trenches) 30 in the back side 24 of the silicon substrate 20. This back side processing may also be referred to as a back side pre-cut. In some embodiments, the recesses 30 are formed by a laser process. In other embodiments, the recesses 30 may be formed by a lithography process, such as an etching process. The recesses 30 follow a pattern in a top view, for example a square pattern, a crisscross pattern (which may include crisscrossing rectangles or crisscrossing triangles), a concentric circles pattern, a radial pattern, hole or rod patterns, or other suitable patterns. The top views of some of these patterns are shown in FIGS. 3-8. In some embodiments, the recesses 30 have substantially identical or substantially similar shapes or sizes.

Still referring to FIG. 2, the recesses 30 effectively form a buffer for the expansion or contraction of the substrate 20 during various epitaxial growth processes used to form the layers on the front side 22 of the substrate 20. These processes may have varying process temperatures, and the substrate 20 may also be cooled between some of these processes as well. These different temperatures may cause the substrate 20 to expand or contract, which may introduce stress for the layers formed on the front side 22 of the substrate 20. With the recesses 30 in place, the substrate 20 now has more room to expand or contract, thereby reducing the amount of stress applied to the layers formed on the front side 22.

The portions of the substrate 20 located between adjacent recesses 30 have a lateral dimension (or width) 40. In some embodiments, the lateral dimension 40 is less than about 100 microns (um). The range for the lateral dimension 40 is chosen so that the remaining portion of the substrate 20 (i.e., after the recesses 30 have been formed therein) can still have room to contract or expand laterally without causing undue stress for the epi-layers grown on the front side 22 of the substrate 20 later.

Also, a remaining portion of the substrate 20 has a vertical dimension (thickness) 50, which is defined as a distance from a front surface (surface facing the front side 22) of the substrate 20 to a bottom of the recesses 30. In some embodiments, the vertical dimension 50 is in a range from about 100 um to about 300 um. The range for the vertical dimension 50 is chosen so that the remaining portion of the substrate 20 can still provide sufficient mechanical support for growing the epi-layers on the front side 22 of the substrate 20.

The specific geometries for the recesses 30 and the substrate 20 for various recess patterns will now be discussed in more detail with reference to FIGS. 3-8, which illustrate planar views (also referred to as birds-eye views of top views). The recesses 30 may also be referred to as scribe lines in the embodiments discussed below.

Figure 3:
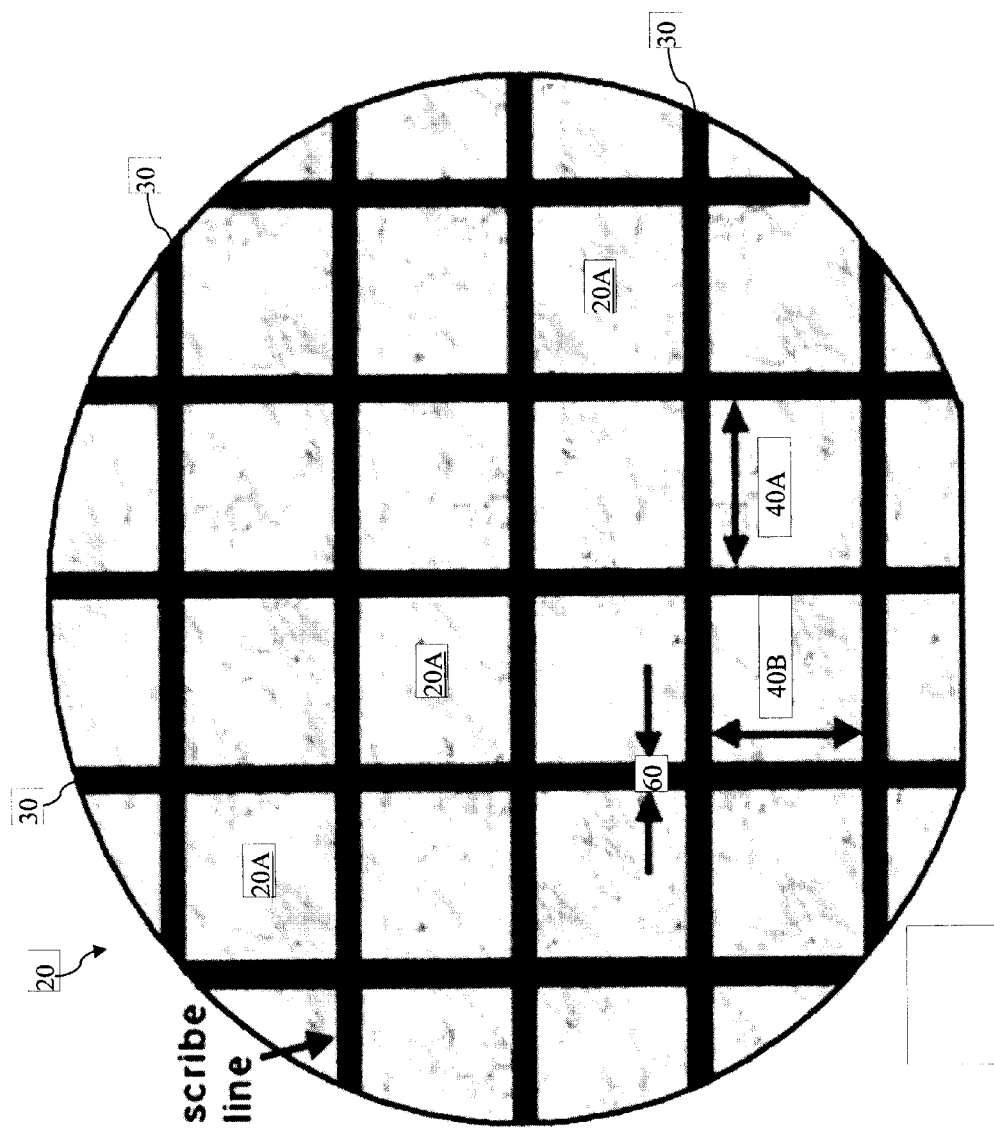
FIGS. 3-8 are diagrammatic planar views of a back side of a substrate processed according to various aspects of the present disclosure.

In the embodiment illustrated in FIG. 3, the recesses 30 define a crisscrossing rectangles pattern on the back side 24 of the substrate 20. In other words, the recesses 30 are arranged in a plurality of intersecting trenches or "lines" across the back side 24 of the substrate 20. In this embodiment, the intersecting recesses 20 are substantially perpendicular to one another. Thus, the back side 24 of the substrate 20 is divided into a plurality of "island-like" rectangles 20A. The rectangles have a horizontal dimension 40A and a vertical dimension 40B in the planar view shown in FIG. 3. It is understood that both the horizontal dimension 40A and the vertical dimension 40B are manifestations of the lateral dimension 40 discussed above and shown in FIG. 2. In some embodiments, the horizontal dimension 40A and the vertical dimension 40B are both in a range from about 1 um to about 100 um. The recesses 30 also have a dimension 60 defining a "width" of the recesses. In some embodiments, the dimension 60 of the recesses is in a range from about 10 um to about 100 um.

Figure 4:
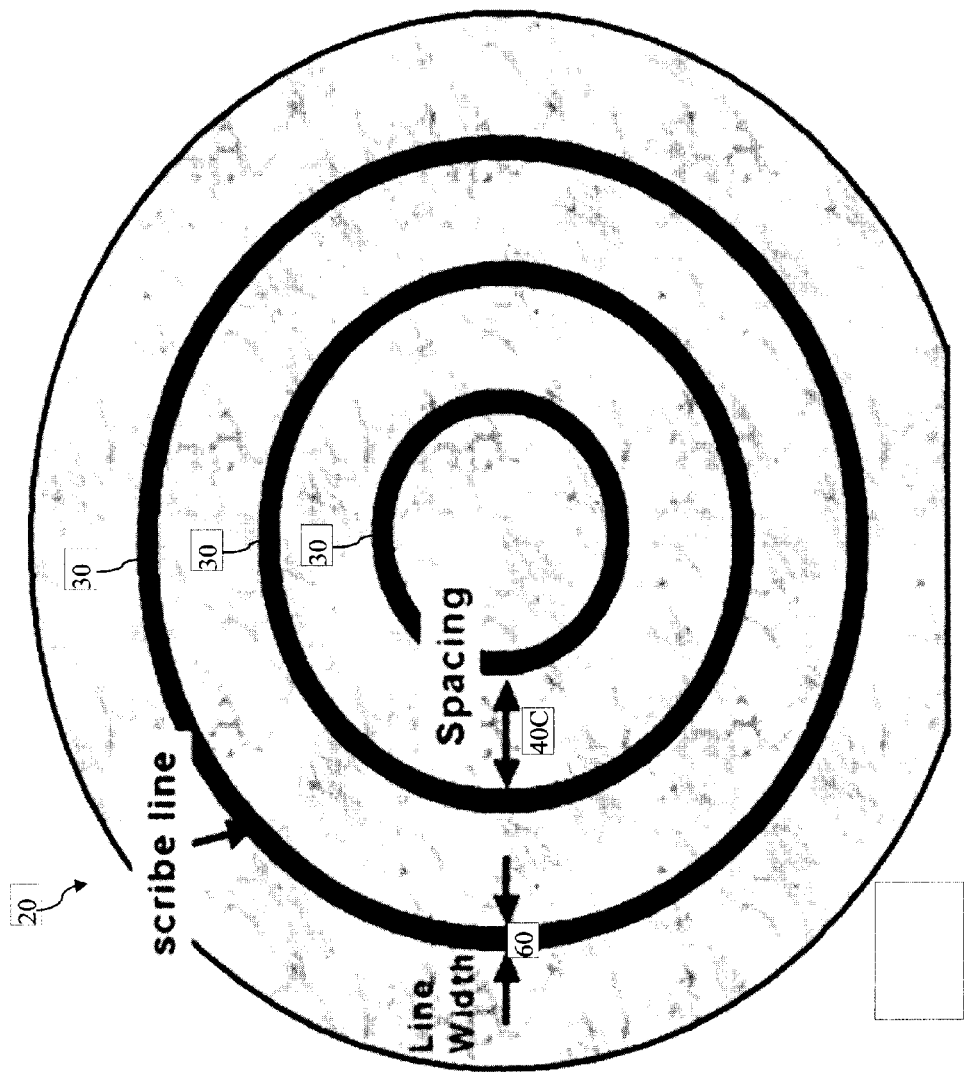

In the embodiment illustrated in FIG. 4, the recesses 30 define a concentric circles pattern on the back side 24 of the substrate 20. In other words, the recesses 30 are arranged in a plurality of circles on the back side 22 of the substrate 20, wherein a smaller circle is located within a larger circle, which is located in an even larger circle, so on and so forth. The circles are spaced apart from adjacent circles by a spacing 40C, which is also a manifestation of the lateral dimension 40 discussed above and shown in FIG. 2. In some embodiments, the spacing 40C is in a range from about 1 um to about 100 um. The circles also each have a "line width", which is the same as the dimension 60 discussed above that defines a "width" of the recesses 30. In some embodiments, the line width 60 of the recesses is in a range from about 10 um to about 100 um.

Figure 5:
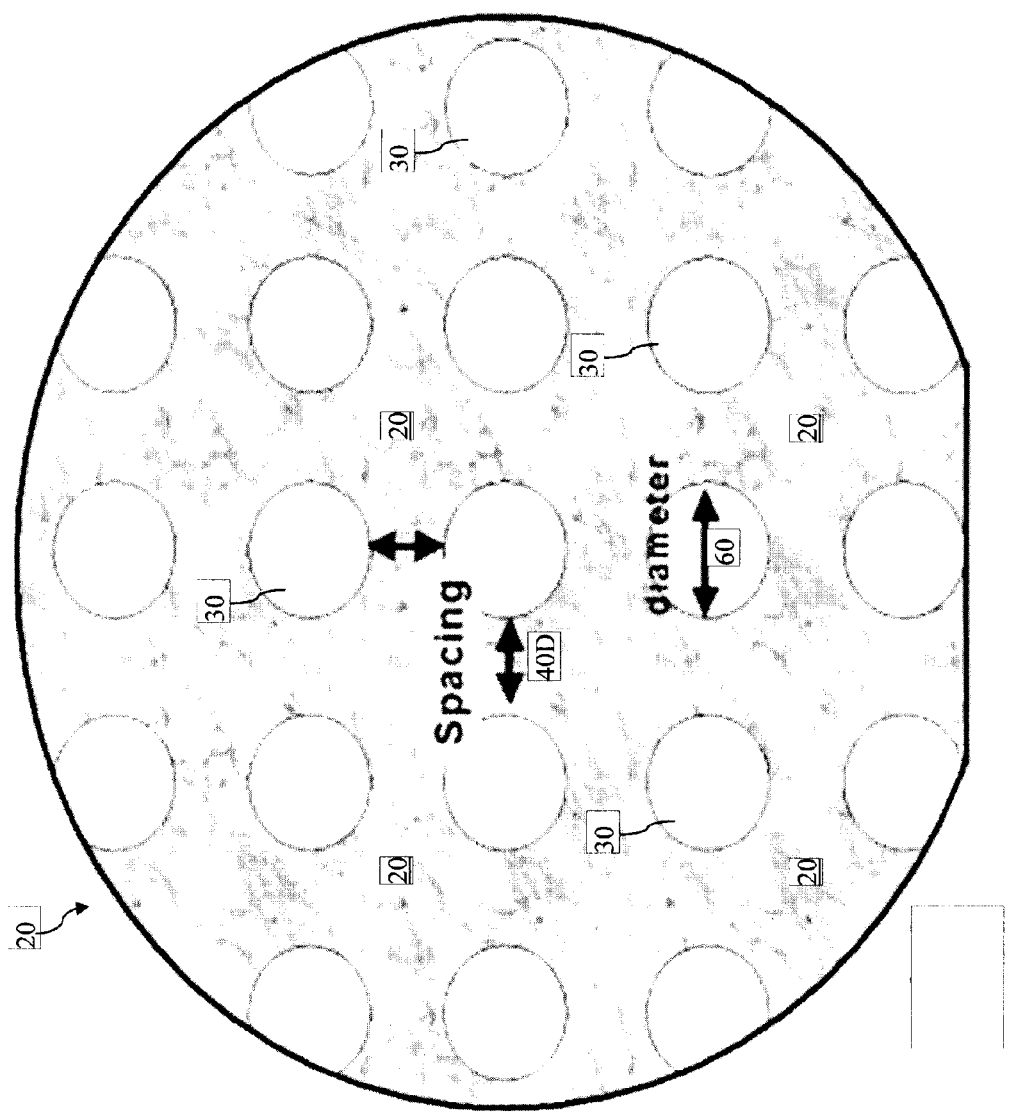

In the embodiment illustrated in FIG. 5, the recesses 30 define a hole pattern on the back side 24 of the substrate 20. In other words, the recesses 30 are arranged as a plurality of holes on the back side 22 of the substrate 20, which may be substantially rounded in some embodiments. The holes are spaced apart from adjacent holes by a spacing 40D, which is also a manifestation of the lateral dimension 40 discussed above and shown in FIG. 2. In some embodiments, the spacing 40D is in a range from about 1 um to about 100 um. The holes also each have a "diameter", which is the same as the dimension 60 discussed above that defines a "width" of the recesses 30. In some embodiments, the diameter 60 of the holes is in a range from about 10 um to about 100 um.

Figure 6:
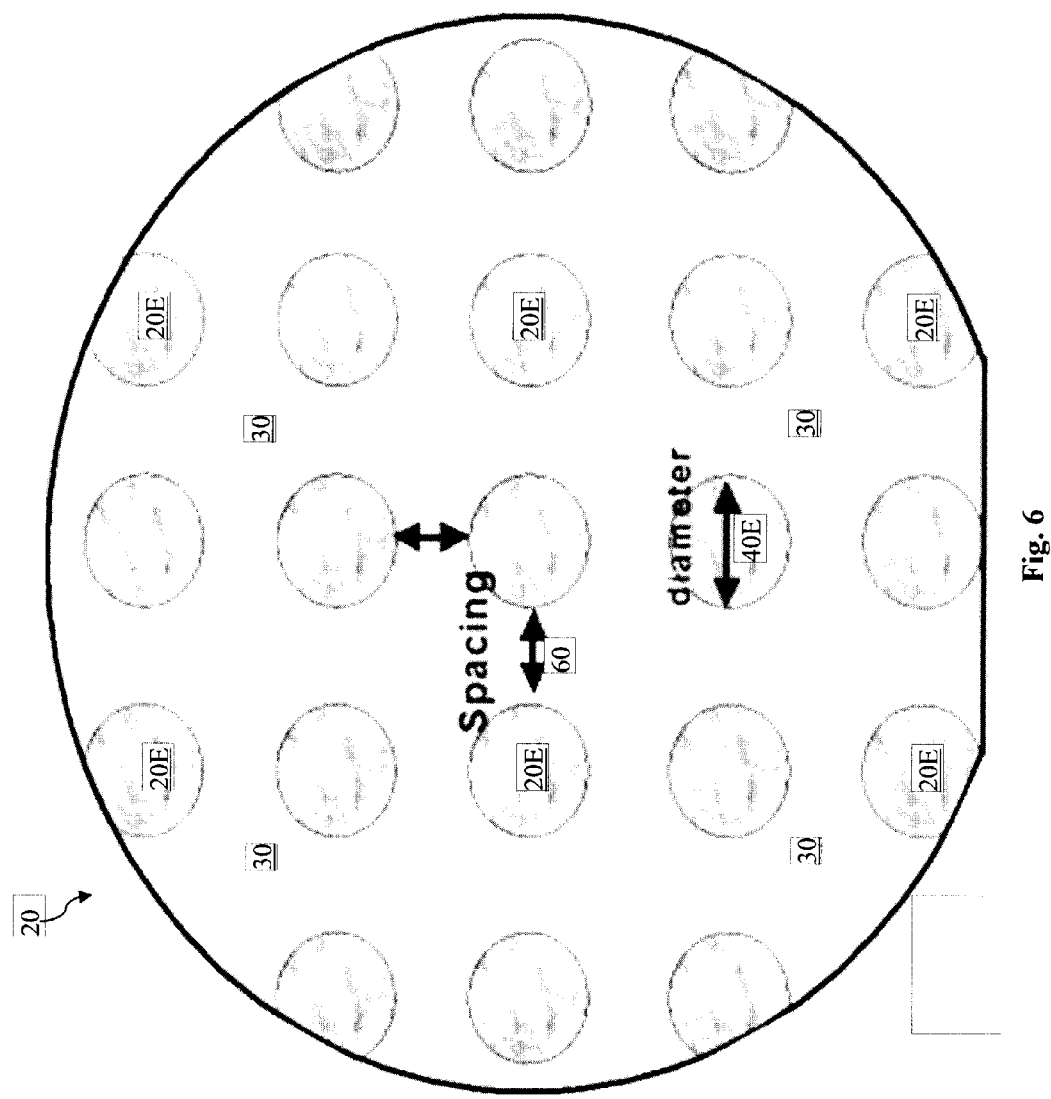

In the embodiment illustrated in FIG. 6, the recesses 30 define a rod pattern on the back side 24 of the substrate 20. In other words, the recesses 30 are formed in the back side 24 of the substrate 20 in a manner such that the remaining portions of the substrate 20E form a plurality of rods, which may be substantially rounded in some embodiments. It may be said that the hole pattern shown in FIG. 5 is an opposite of the rod pattern shown in FIG. 6. Stated differently, the rounded holes 30 in FIG. 5 are formed by the recesses 30 in the substrate 20, whereas the rounded rods 20E in FIG. 6 are formed by the portions of the substrate 20 themselves. The rods are spaced apart from adjacent rods by a spacing 60, which is the same as the lateral dimension 60 discussed above that defines a "width" of the recesses 30. In some embodiments, the spacing 60 between the adjacent rods is in a range from about 10 um to about 100 um. The rods 20E also each have a diameter 40E, which is a manifestation of the lateral dimension 40 discussed above and shown in FIG. 2. In some embodiments, the spacing 40E is in a range from about 1 um to about 100 um.

Figure 7:
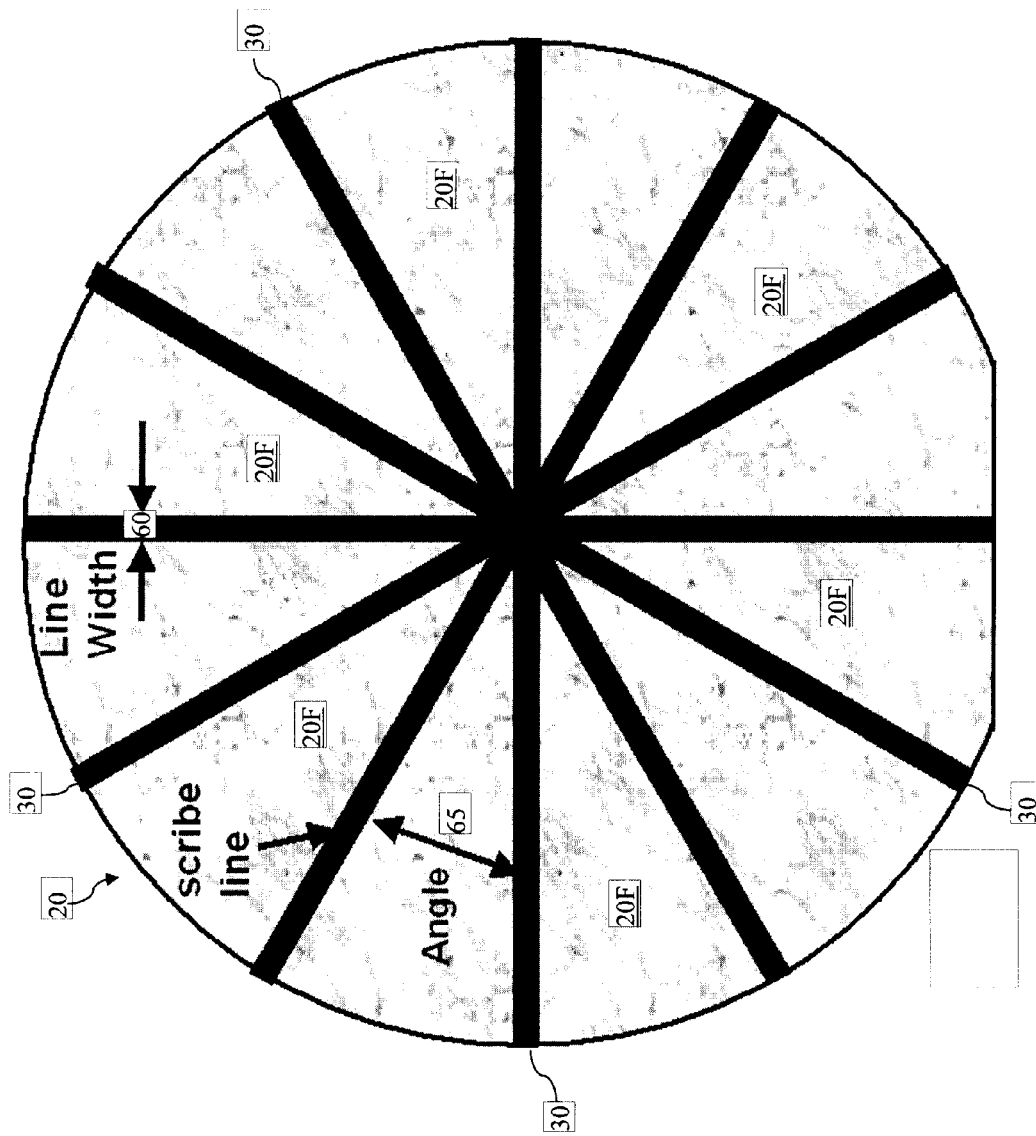

In the embodiment illustrated in FIG. 7, the recesses 30 define a radial pattern on the back side 24 of the substrate 20. In other words, the recesses 30 are arranged in a plurality of trenches that extend radially outwards across the back side 24 of the substrate 20. Each of these radially-extending trenches intersects with one or more other radially extending trenches. Thus, the back side 24 of the substrate 20 is divided into a plurality of "sectors" 20F. These sectors have angles 65. In some embodiments, the angles 65 are in a range between about 1 degree and about 90 degrees. The radially-extending trenches also each have a "line width", which is the same as the dimension 60 discussed above that defines a "width" of the recesses 30. In some embodiments, the line width 60 of the recesses is in a range from about 10 um to about 100 um.

Figure 8:
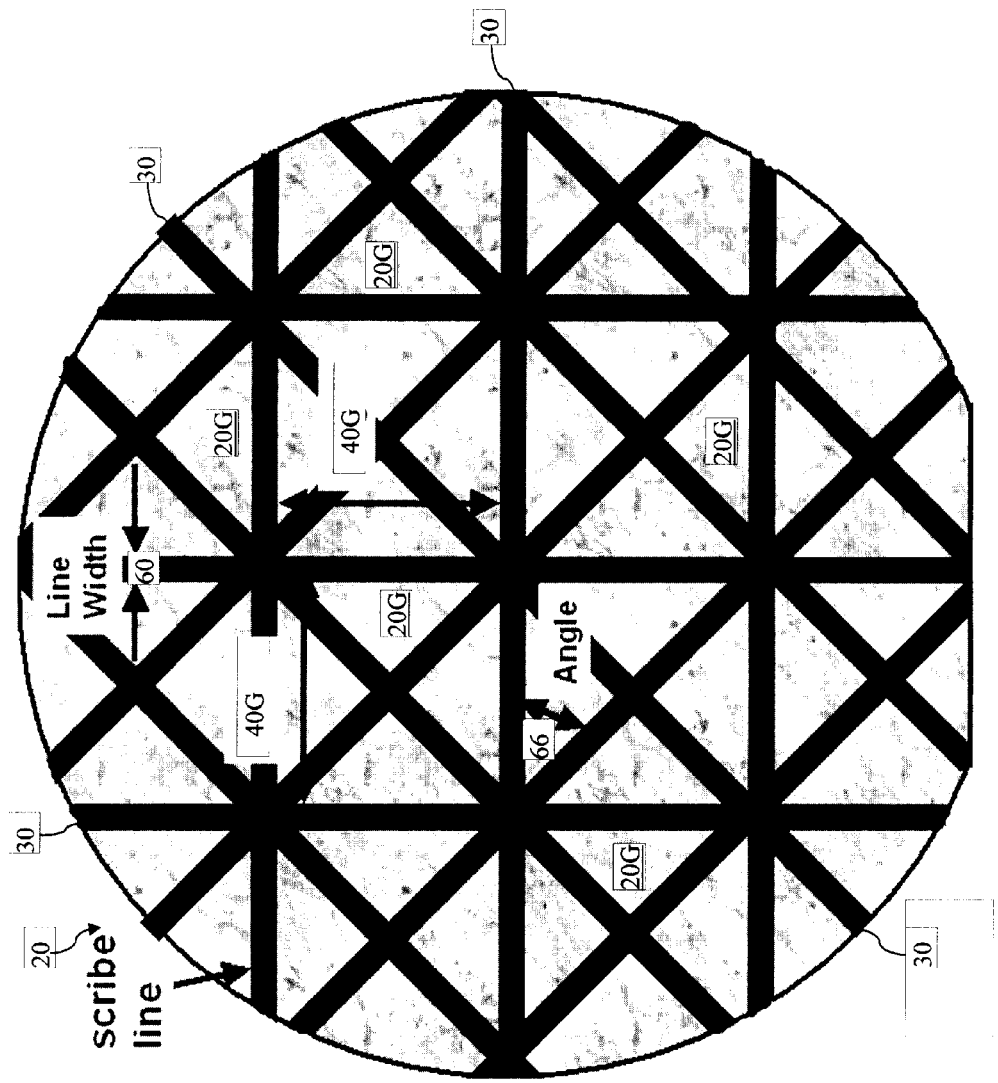

In the embodiment illustrated in FIG. 8, the recesses 30 define a crisscrossing triangles pattern for the back side 24 of the substrate 20. In other words, the recesses 30 are arranged in a plurality of intersecting trenches or "lines" to define a plurality of triangles 20G across the back side 24 of the substrate 20. The triangles have a maximum dimension 40G in the planar view shown in FIG. 8. It is understood that the maximum dimension 40G is manifestation of the lateral dimension 40 discussed above and shown in FIG. 2. In some embodiments, the maximum dimension 40G is in a range from about 1 um to about 100 um. The recesses 30 also have a dimension 60 defining a "width" of the recesses. In some embodiments, the dimension 60 of the recesses is in a range from about 10 um to about 100 um.

Figure 9:
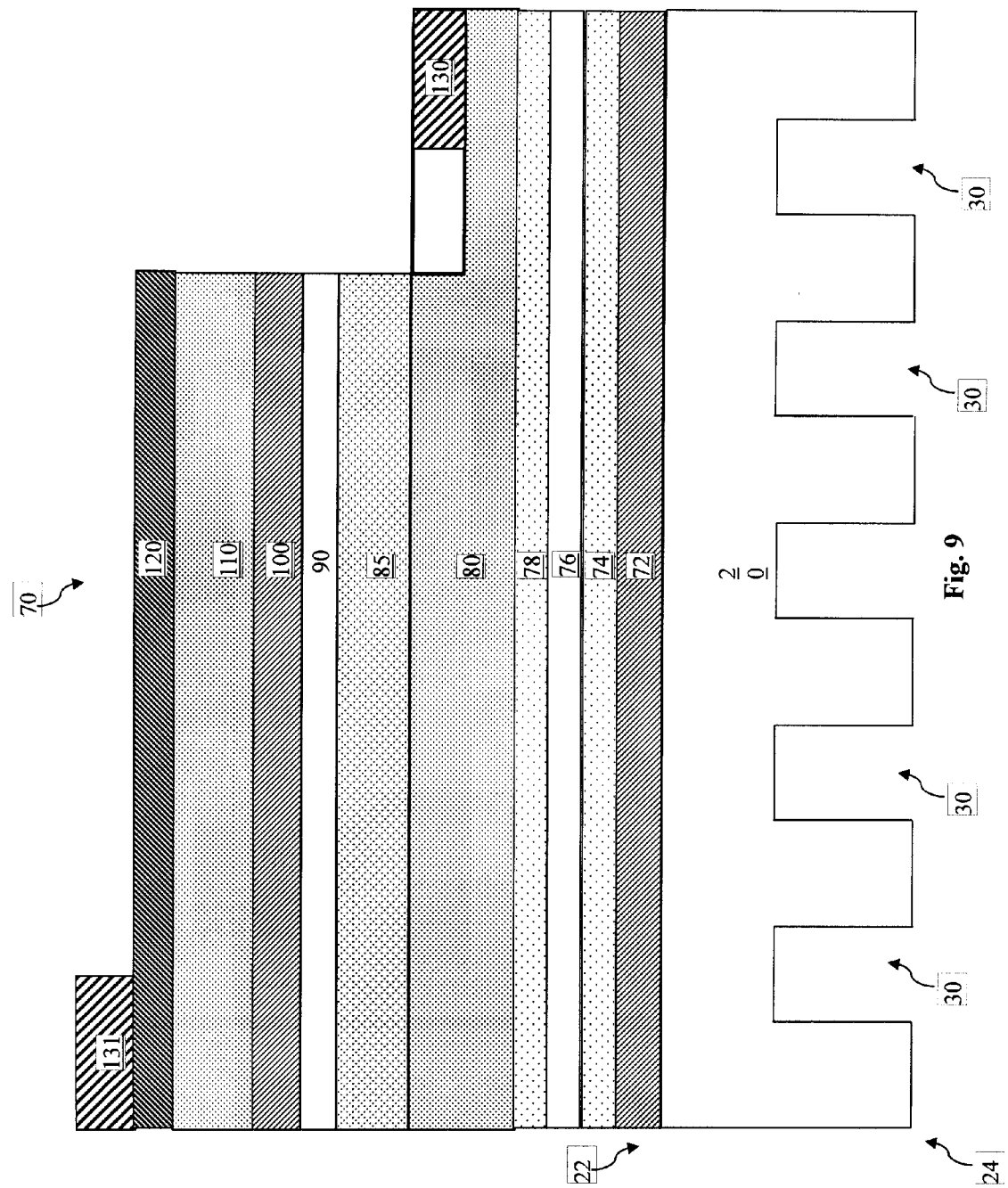
FIGS. 9-11 are diagrammatic fragmentary cross cross-sectional side views of example light-emitting diodes (LEDs) according to various aspects of the present disclosure.
Figure 10:
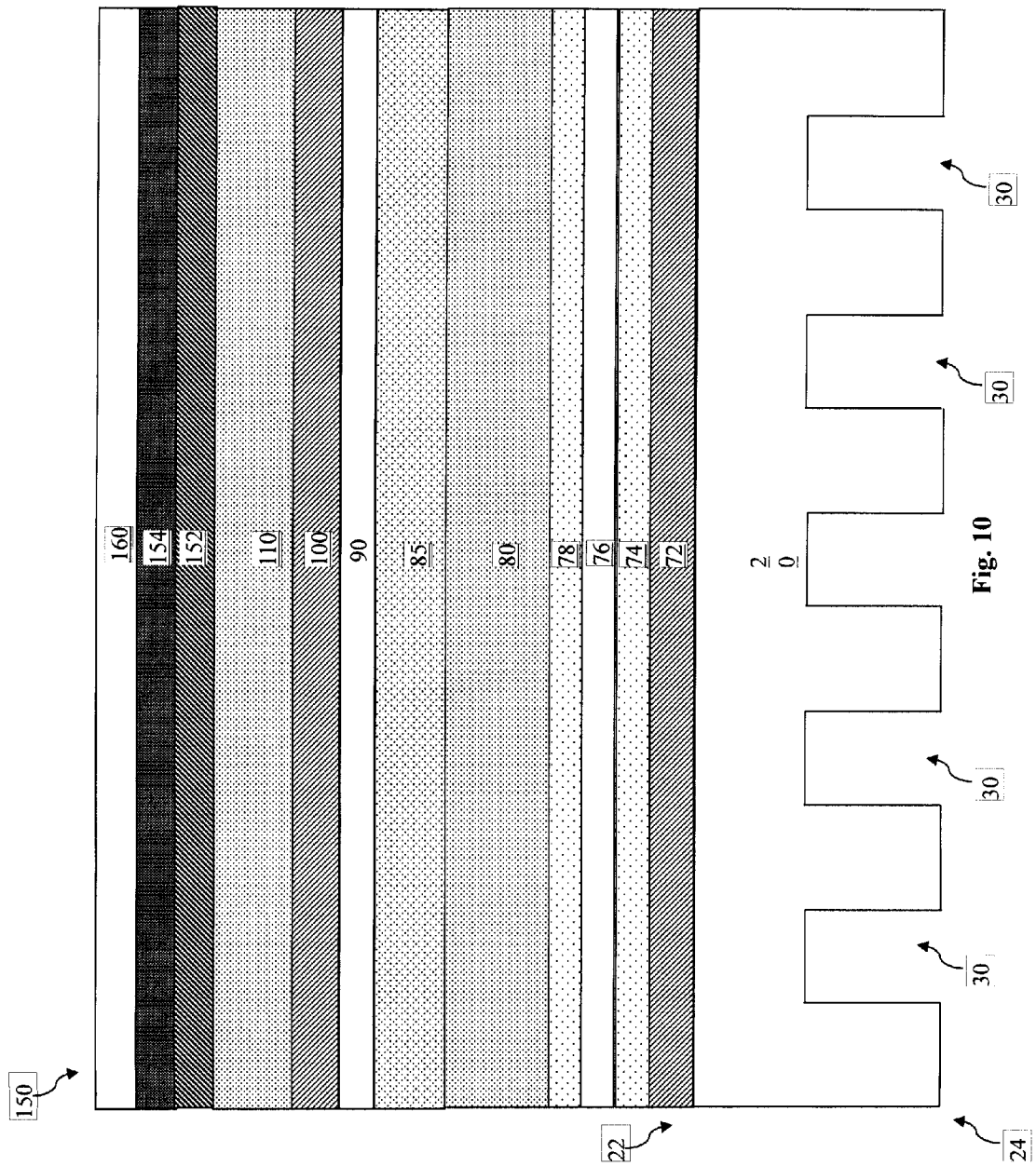
Figure 11:
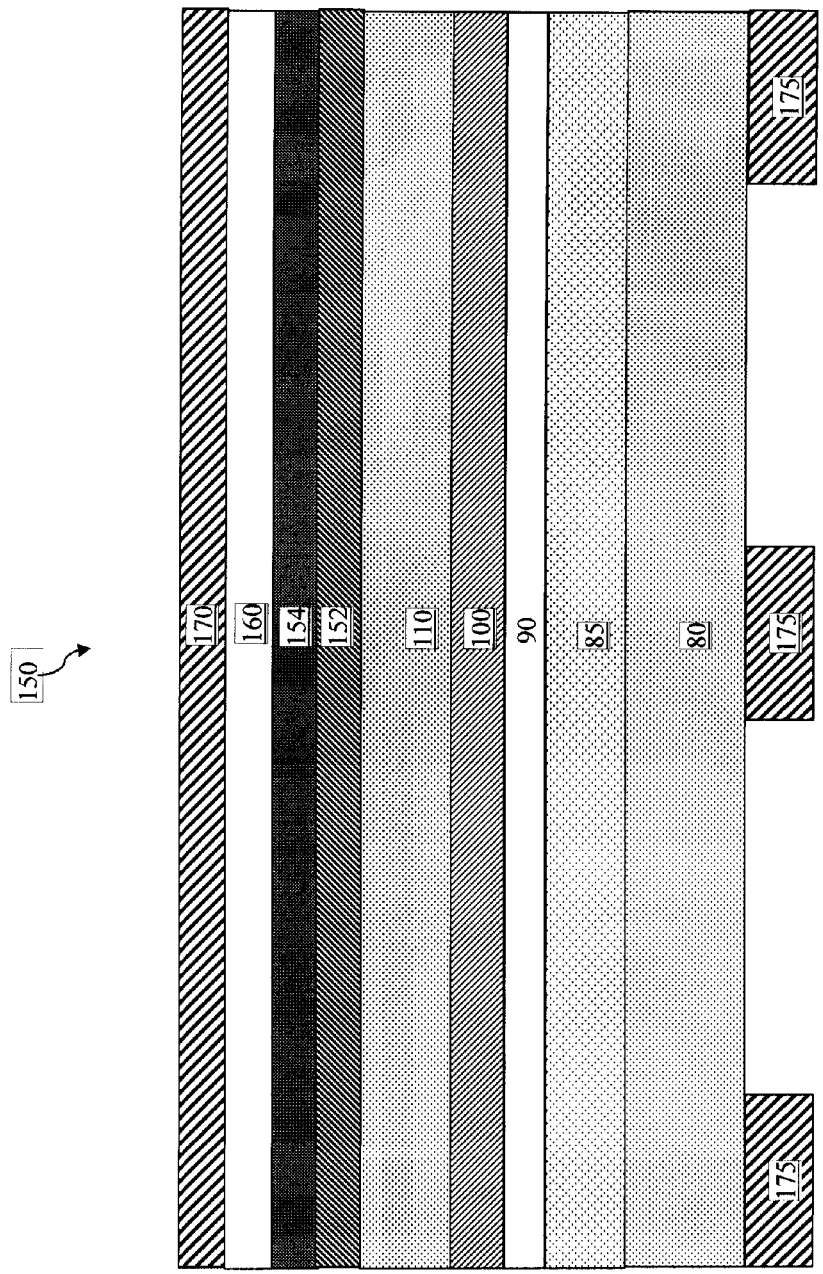

FIGS. 9-11 are diagrammatic cross-sectional fragmentary side views for several types of devices that can utilize the substrate back side pre-cutting pattern to help grow better III-V group compound layers on the front side of the substrate. FIGS. 9 to 11 have been simplified for a better understanding of the inventive concepts of the present disclosure.

A horizontal LED device 70 is shown in FIG. 9. The horizontal LED 70 includes the substrate 20 in which the plurality of recesses 30 have been formed in the back side 24, as discussed above. The substrate 20 is a portion of a silicon wafer. In certain embodiments, before any epitaxial growth process is performed, the substrate 20 is cleaned by boiling it in a sulfuric acid solution ($H_2SO_4$:$H_2O_2$ with a 3:1 ratio) for about 15 minutes, and then dipping it in a hydrofluoric acid solution (HF:$H_2O$ with a 1:10 ratio) for about 15 seconds to remove native oxide formed on the surface of the substrate 20. After the cleaning process, the silicon substrate 20 is loaded into an epitaxial growth chamber and then heated to a temperature in a range from about 1000 degrees Celsius to about 1150 degrees Celsius under an $H_2$ ambient for about 5 to 10 minutes to remove a surface passivation layer.

A buffer layer 72 is then formed over the front side 22 of the substrate 20. The buffer layer 72 is formed in an epitaxial growth process. In some embodiments, the epitaxial growth process has a process temperature less than about 1200 degrees Celsius. In certain embodiments, the buffer layer 72 may include a step aluminum (Al) grade-composition buffer, which may contain an aluminum nitride (AlN) layer and a plurality of aluminum gallium nitride (AlGaN) layers formed over the AlN layer, where the AlGaN layers have increasing thicknesses the farther they are from the substrate 20, and where the aluminum concentration decreases the farther they are from the substrate. Such buffer layer is described in more detail in U.S. patent application Ser. No. 13/398,954, filed on Feb. 17, 2012, and entitled "METHOD OF GROWING A HIGH QUALITY III-V COMPOUND LAYER ON A SILICON SUBSTRATE," the contents of which are hereby incorporated by reference in their entirety.

A first gallium nitride (GaN, a type of III-V group compound) layer 74 is formed over the buffer layer 72. An AlN layer 76 is then formed over the first GaN layer 74. A second GaN layer 78 is then formed over the AlN layer 76. These layers 74-78 may each be formed by an epitaxial growth process.

A doped semiconductor layer 80 is then formed over the second GaN layer 78. The doped semiconductor layer 80 is formed by an epitaxial growth process known in the art. In the illustrated embodiments, the doped semiconductor layer 80 is doped with an n-type dopant, for example Carbon (C) or Silicon (Si). The doped semiconductor layer 80 includes a III-V group compound, which is gallium nitride in the present embodiment. Thus, the doped semiconductor layer 80 may also be referred to as nGaN layer. In some embodiments, the nGaN layer 80 has a thickness that is in a range from about 2 μm to about 6 um.

A pre-layer 85 is formed over the nGaN layer 80. The pre-layer 85 may include a plurality of pairs of indium gallium nitride (InGaN) and gallium nitride (GaN), for example between about 15 and 25 pairs. The In content may be in a range from about 0.1 to about 0.2. A thickness of the InGaN is in a range from about 0.5 nm to about 2 nm, and a thickness of the GaN is in a range from about 1 nm to about 3 nm.

A multiple-quantum well (MQW) layer 90 is formed over the pre-layer 85. The MQW layer 90 includes alternating (or periodic) sub-layers of active material, such as gallium nitride and indium gallium nitride (InGaN). For example, the MQW layer 90 may include a number of gallium nitride sub-layers and a number of indium gallium nitride sub-layers, wherein the gallium nitride sub-layers and the indium gallium nitride sub-layers are formed in an alternating or periodic manner. In one embodiment, the MQW layer 90 includes ten sub-layers of gallium nitride and ten sub-layers of indium gallium nitride, where an indium gallium nitride sub-layer is formed on a gallium nitride sub-layer, and another gallium nitride sub-layer is formed on the indium gallium nitride sub-layer, and so on and so forth. Each of the sub-layers within the MQW layer is doped with a different type of conductivity from its adjacent sub-layer. That is, the various sub-layers within the MQW layer are doped in an alternating p-n fashion. The light emission efficiency depends on the number of layers of alternating layers and their thicknesses. In some embodiments, the MQW layer 90 has a thickness in a range from about 90 nanometers (nm) to about 200 nm. At the top of the MQW layer 90, there is an InAlGaN last barrier layer, which may have an aluminum content between 0 and 1, and an indium content between 0 and 1, and a thickness between about 7 nm and about 25 nm. This InAlGaN last barrier layer may or may not be considered a part of the MQW layer 90 and is not specifically illustrated herein.

An electron blocking layer 100 may optionally be formed over the MQW layer 90. The electron blocking 100 layer helps confine electron-hole carrier recombination within the MQW layer 90, which may improve quantum efficiency of the MQW layer 90 and reduce radiation in undesired bandwidths. In some embodiments, the electron blocking layer 100 may include a doped indium aluminum gallium nitride (InAlGaN) material, and the dopant may include a p-type dopant such as Magnesium. In some embodiments, the electron blocking layer 100 may have an aluminum content between 0 and 1, and an indium content between 0 and 1, and a thickness between about 10 nm and about 25 nm.

A doped semiconductor layer 110 is formed over the electron blocking layer 100 (and thus over the MQW layer 90). The doped semiconductor layer 110 is formed by an epitaxial growth process known in the art. In some embodiment, the doped semiconductor layer 110 is doped with a dopant having an opposite (or different) type of conductivity from that of the doped semiconductor layer 80. Thus, in the embodiment where the doped semiconductor layer 80 is doped with an n-type dopant, the doped semiconductor layer 110 is doped with a p-type dopant. The doped semiconductor layer 110 includes a III-V group compound, which is a gallium nitride compound in the illustrated embodiments. Thus, the doped semiconductor layer 110 may also be referred to as a pGaN layer. In some embodiments, the pGaN layer 110 has a thickness that is in a range from about 150 nm to about 200 nm.

A core portion of the LED 70 is created by the disposition of the MQW layer 90 between the nGaN layer 80 and the pGaN layer 110. When an electrical voltage (or electrical charge) is applied to the doped layers of the LED 70, the MQW layer 90 emits radiation such as light. The color of the light emitted by the MQW layer 90 corresponds to the wavelength of the radiation. The radiation may be visible, such as blue light, or invisible, such as ultraviolet (UV) light. The wavelength of the light (and hence the color of the light) may be tuned by varying the composition and structure of the materials that make up the MQW layer 90.

Additional processes may be performed to complete the fabrication of the LED 70. For example, an electrically-conductive contact layer 120 may be formed over the pGaN layer 110. A portion of the layer 80 is etched away so that a part of nGaN layer 80 is exposed. Metal contacts 130-131 may then be formed on the surface of the exposed nGaN layer 80 and on the surface of the contact layer 120, respectively. The metal contacts 130-131 are formed by one or more deposition and patterning processes. The metal contacts 130-131 allow electrical access to the doped semiconductor layer 80 and to the doped semiconductor layer 110, respectively.

The LED 70 discussed above with reference to FIG. 9 pertains to a horizontal LED. Similarly, a vertical LED may also be fabricated to incorporate the improved MQW layer 90. For example, FIG. 10 illustrates an example of such vertical LED 150. Similar components in the vertical and horizontal LEDs are labeled the same for reasons of consistency and clarity.

Referring to FIG. 10, the vertical LED 150 contains many same materials as those shown in the horizontal LED 70 of FIG. 9. Thus, similar elements are labeled the same for reasons of clarity and consistency. An InGaN layer 152 is formed over the pGaN layer 110. The InGaN layer 152 may be p-doped or undoped. A bonding metal layer 154 is formed over the InGaN layer 152. Thereafter, a submount 160 is bonded to the bonding metal layer 154. The submount 160 may contain a ceramic material or a silicon material in various embodiments.

Referring now to FIG. 11, a p-contact layer 170 is formed over the submount 160. The p-contact layer 170 may include a metal material suitable for conducting electricity. The silicon substrate 20 is also removed by wet etching, for example by a solution containing HF, acetic acid ($CH_3COOH$), or oxalic acid (HOOC—COOH). The various layers formed between the silicon substrate 20 and the nGaN layer 80 may also be removed, for example by a reactive ion etching process. The removal of the silicon substrate 20 is made easier by the recesses 30 formed in the back side 24 of the silicon substrate 20. This is at least in part due to the fact that the recesses 30 effectively increase the surface area of the silicon substrate 20. As a result, the wet etching solutions can come into contact with the silicon substrate 20 more effectively, and therefore remove the silicon more effectively. In addition, the recesses 30 correspond to the absence of silicon material in the silicon substrate 20, meaning less silicon needs to be etched away. This also makes the removal of the silicon substrate 20 easier. Thereafter, one or more n-contacts 175 are formed on the exposed surface of the nGaN layer from the back side. The p-contact layer 170 and the n-contacts 175 provide electrical access to the vertical LED 150.

To complete the fabrication of the horizontal LED 70 or the vertical LED 150, additional processes such as dicing, packaging, and testing processes may also be performed, but they are not illustrated herein for the sake of simplicity.

Figure 12:
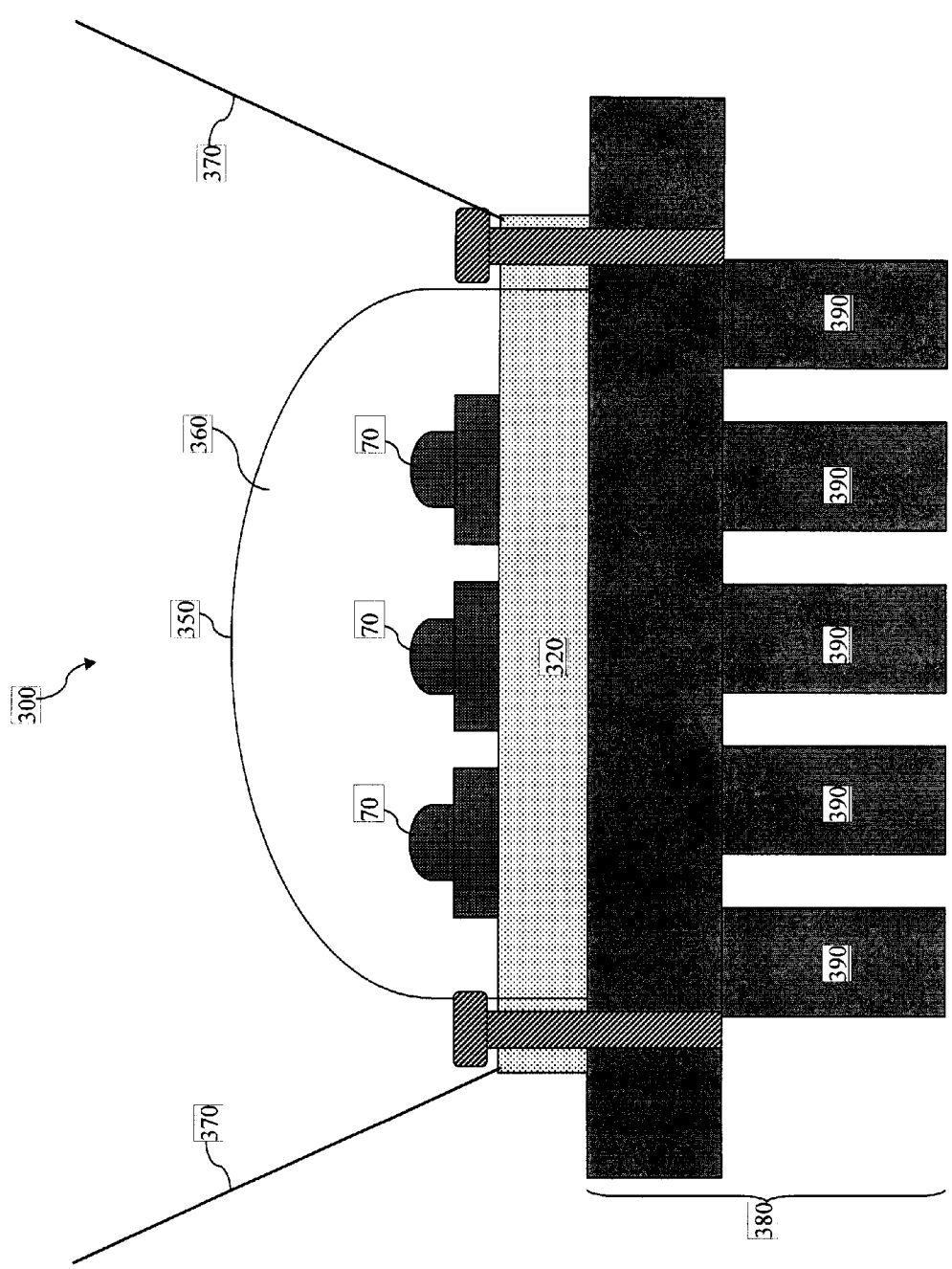
FIG. 12 is a diagrammatic fragmentary cross-sectional side view of an example LED lighting apparatus according to various aspects of the present disclosure.

The LED 70 (or the LED 150) discussed above may be implemented as a part of a lighting apparatus. For example, the LED 70 (or the LED 150) may be implemented as a part of a LED-based lighting instrument 300, a simplified cross-sectional view of which is shown in FIG. 12. The embodiment of the LED-based lighting instrument 300 shown in FIG. 12 includes a plurality of LED dies. In other embodiments, the lighting instrument 300 may include a single LED die.

As discussed above, the LED dies include an n-doped III-V group compound layer, a p-doped III-V group compound layer, and a MQW layer disposed between the n-doped and p-doped III-V group compound layers. In some embodiments, the LED dies 70 each have a phosphor layer coated thereon. The phosphor layer may include either phosphorescent materials and/or fluorescent materials. The phosphor layer may be coated on the surfaces of the LED dies 70 in a concentrated viscous fluid medium (e.g., liquid glue). As the viscous liquid sets or cures, the phosphor material becomes a part of the LED package. In practical LED applications, the phosphor layer may be used to transform the color of the light emitted by an LED dies 70. For example, the phosphor layer can transform a blue light emitted by an LED die 70 into a different wavelength light. By changing the material composition of the phosphor layer, the desired light color emitted by the LED die 70 may be achieved.

The LED dies 70 are mounted on a substrate 320. In some embodiments, the substrate 320 includes a Metal Core Printed Circuit Board (MCPCB). The MCPCB includes a metal base that may be made of aluminum (or an alloy thereof). The MCPCB also includes a thermally conductive but electrically insulating dielectric layer disposed on the metal base. The MCPCB may also include a thin metal layer made of copper that is disposed on the dielectric layer. In alternative embodiments, the substrate 320 may include other suitable thermally conductive structures. The substrate 320 may or may not contain active circuitry and may also be used to establish interconnections.

The lighting instrument 300 includes a diffuser cap 350. The diffuser cap 350 provides a cover for the LED dies 70 therebelow. Stated differently, the LED dies 70 are encapsulated by the diffuser cap 350 and the substrate 320 collectively. In some embodiments, the diffuser cap 350 has a curved surface or profile. In some embodiments, the curved surface may substantially follow the contours of a semicircle, so that each beam of light emitted by the LED dies 70 may reach the surface of the diffuser cap 350 at a substantially right incident angle, for example, within a few degrees of 90 degrees. The curved shape of the diffuser cap 350 helps reduce Total Internal Reflection (TIR) of the light emitted by the LED dies 70.

The diffuser cap 350 may have a textured surface. For example, the textured surface may be roughened, or may contain a plurality of small patterns such as polygons or circles. Such textured surface helps scatter the light emitted by the LED dies 70 so as to make the light distribution more uniform. In some embodiments, the diffuser cap 350 is coated with a diffuser layer containing diffuser particles.

In some embodiments, a space 360 between the LED dies 70 and the diffuser cap 350 is filled by air. In other embodiments, the space 360 may be filled by an optical-grade silicone-based adhesive material, also referred to as an optical gel. Phosphor particles may be mixed within the optical gel in that embodiment so as to further diffuse light emitted by the LED dies 70.

Though the illustrated embodiment shows all of the LED dies 70 being encapsulated within a single diffuser cap 350, it is understood that a plurality of diffuser caps may be used in other embodiments. For example, each of the LED dies 70 may be encapsulated within a respective one of the plurality of diffuser caps.

The lighting instrument 300 may also optionally include a reflective structure 370. The reflective structure 370 may be mounted on the substrate 320. In some embodiments, the reflective structure is shaped like a cup, and thus it may also be referred to as a reflector cup. The reflective structure encircles or surrounds the LED dies 70 and the diffuser cap 350 in 360 degrees from a top view. From the top view, the reflective structure 370 may have a circular profile, a beehive-like hexagonal profile, or another suitable cellular profile encircling the diffuser cap 350. In some embodiments, the LED dies 70 and the diffuser cap 350 are situated near a bottom portion of the reflective structure 370. Alternatively stated, the top or upper opening of the reflective structure 370 is located above or over the LED dies 70 and the diffuser cap 350.

The reflective structure 370 is operable to reflect light that propagates out of the diffuser cap 350. In some embodiments, the inner surface of reflective structure 370 is coated with a reflective film, such as aluminum, silver, or alloys thereof. It is understood that the surface of the sidewalls of the reflective structure 370 may be textured in some embodiments, in a manner similar to the textured surface of the diffuser cap 350. Hence, the reflective structure 370 is operable to perform further scattering of the light emitted by the LED dies 70, which reduces glare of the light output of the lighting instrument 300 and makes the light output friendlier to the human eye. In some embodiments, the sidewalls of the reflective structure 370 have a sloped or tapered profile. The tapered profile of the reflective structure 370 enhances the light reflection efficiency of the reflective structure 370.

The lighting instrument 300 includes a thermal dissipation structure 380, also referred to as a heat sink 380. The heat sink 380 is thermally coupled to the LED dies 70 (which generate heat during operation) through the substrate 320. In other words, the heat sink 380 is attached to the substrate 320, or the substrate 320 is located on a surface of the heat sink 380. The heat sink 380 is configured to facilitate heat dissipation to the ambient atmosphere. The heat sink 380 contains a thermally conductive material, such as a metal material. The shape and geometries of the heat sink 380 are designed to provide a framework for a familiar light bulb while at the same time spreading or directing heat away from the LED dies 70. To enhance heat transfer, the heat sink 380 may have a plurality of fins 390 that protrude outwardly from a body of the heat sink 380. The fins 390 may have substantial surface area exposed to ambient atmosphere to facilitate heat transfer.

Figure 13:
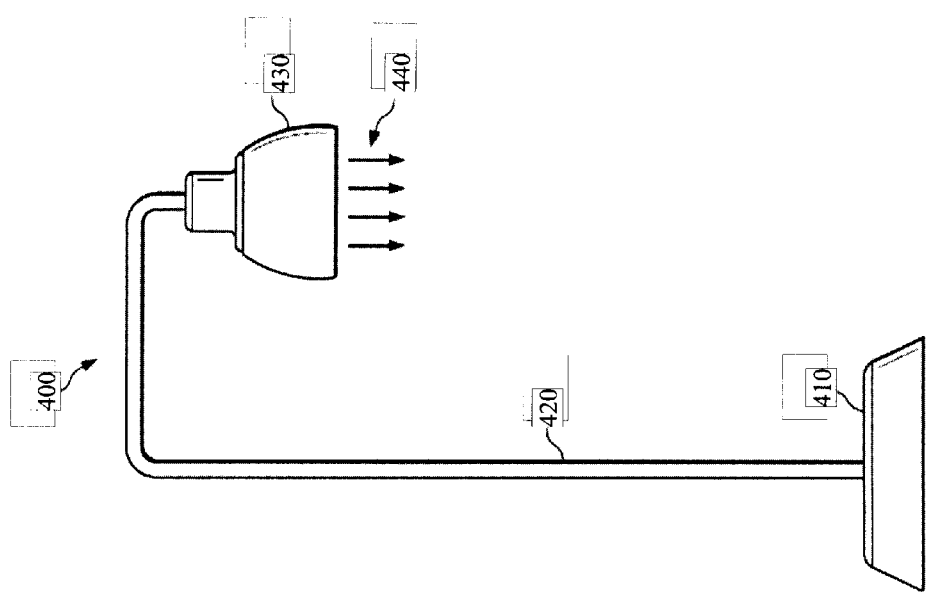
FIG. 13 is a diagrammatic view of a lighting module that includes the LED lighting apparatus of FIG. 12 according to various aspects of the present disclosure.

FIG. 13 illustrates a simplified diagrammatic view of a lighting module 400 that includes some embodiments of the lighting instrument 300 discussed above. The lighting module 400 has a base 410, a body 420 attached to the base 410, and a lamp 430 attached to the body 420. In some embodiments, the lamp 430 is a down lamp (or a down light lighting module). The lamp 430 includes the lighting instrument 300 discussed above with reference to FIG. 12. The lamp 430 is operable to efficiently project light beams 440. In addition, the lamp 430 can offer greater durability and longer lifetime compared to traditional incandescent lamps.

Figure 14:
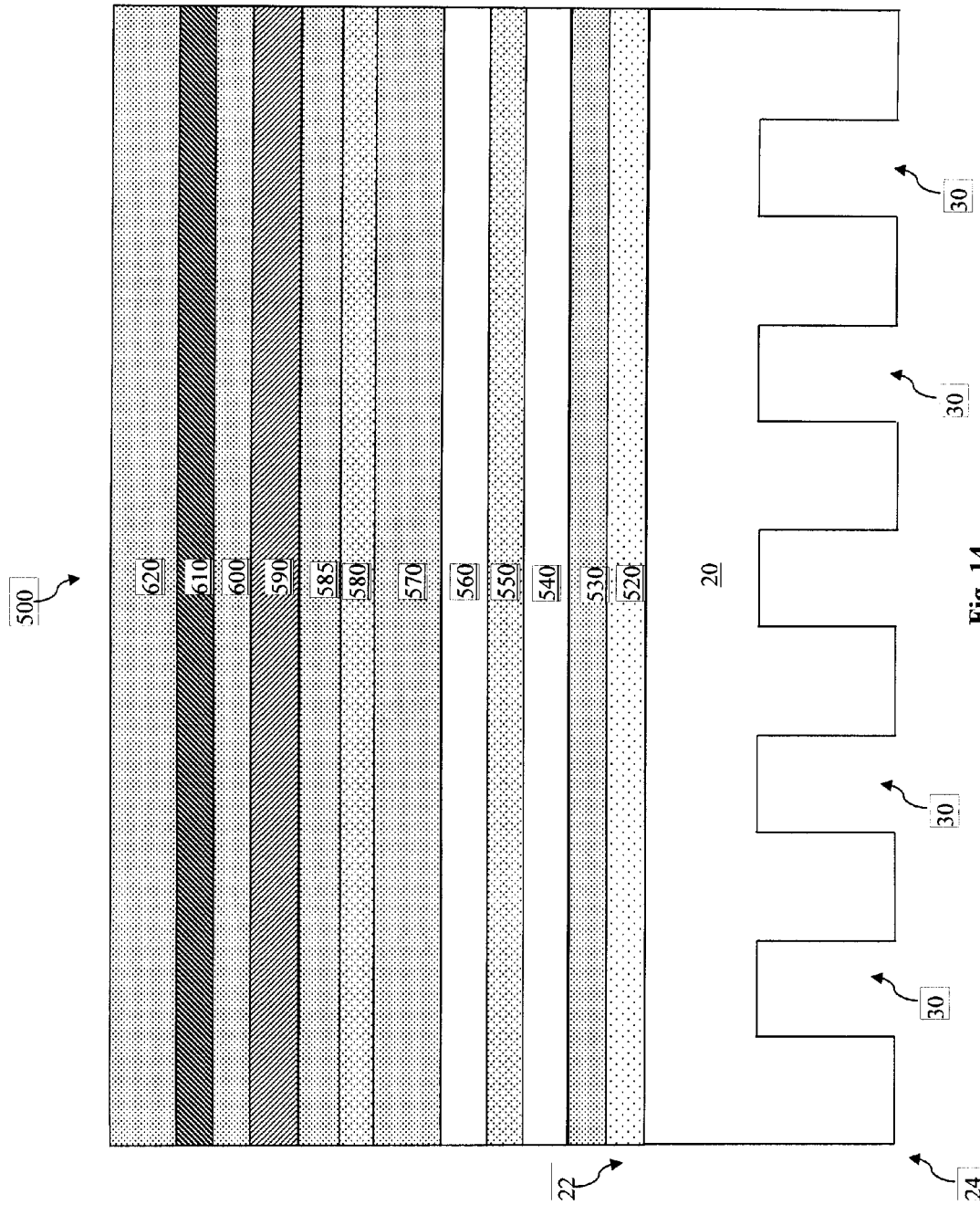
FIG. 14 is a diagrammatic fragmentary cross cross-sectional side view of an example laser diode (LD) according to various aspects of the present disclosure.

The discussions above illustrate how pre-cutting the back side of a silicon substrate reduces stress and allows for better III-V group compound layer epi-growth on the silicon substrate. Though LEDs are used as an example for a scenario where III-V group compound (e.g., GaN) is grown on the silicon substrate, the same concept can be applied to laser diodes (LD) as well, since an LD also benefit from better epi-growth of III-V group compounds on a silicon substrate. FIG. 14 illustrates a simplified cross-sectional side view of an embodiment of an LD 500 according to various aspects of the present disclosure.

The LD 500 includes a substrate 20, which is a silicon substrate in the embodiment shown. As discussed above, a plurality of recesses 30 are formed in the back side 24 of the silicon substrate 20 to reduce stress, so that III-V group compound layers can be grown on the front side 22 of the silicon substrate with reduced stress and reduced cracking.

A III-V group compound layer 520 is formed over the substrate 20 on the front side 22. In some embodiments, the III-V group compound layer 520 includes AlN. Another III-V group compound layer 530 is formed over the III-V group compound layer 20. In some embodiments, the III-V group compound layer 530 includes a plurality of sub-layers, for example AlGaN sub-layers. The thicknesses for these sub-layers may increase, and the aluminum content for these sub-layers may decrease, as the sub-layer go up (i.e., farther away from the substrate 20).

A III-V group compound epi layer 540 is then formed over the III-V group compound layer 530. In some embodiments, the III-V group compound epi layer 540 may include GaN. Thereafter, an AlN layer or an AlGaN layer 550 is formed over the III-V group compound epi layer 540. Another III-V group compound epi layer 560 is then formed over the AlN or AlGaN layer 550.

An n-doped III-V group compound layer 570 is then formed over the III-V group compound epi layer 560. In some embodiments, the n-doped III-V group compound layer 570 includes n-type doped GaN. A plurality of other layers 580 may be formed over the n-doped III-V group compound layer 570, for example including an n-doped InGaN layer, a cladding layer containing n-doped InAlGaN, and a guiding layer containing n-doped InGaN.

Thereafter, a MQW layer 585 may be formed over the layer 580 (and over the n-doped III-V group compound layer 570). The MQW layer 585 includes interleaving barrier layers and active layers, for example interleaving InGaN and GaN layers.

An electron blocking layer 590 is formed over the MQW layer 90. In some embodiments, the electron blocking layer 590 includes p-doped InAlGaN. Thereafter, a guiding layer 600 is formed over the electron blocking layer 590. In some embodiments, the guiding layer 600 includes a p-doped InGaN. A cladding layer 610 is then formed over the guiding layer. In some embodiments, the cladding layer 610 includes a p-doped InAlGaN. A p-doped III-V group compound layer 620 is then formed over the cladding layer 610. In some embodiments, the p-doped III-V group compound layer 570 includes p-type doped GaN.

Figure 15:
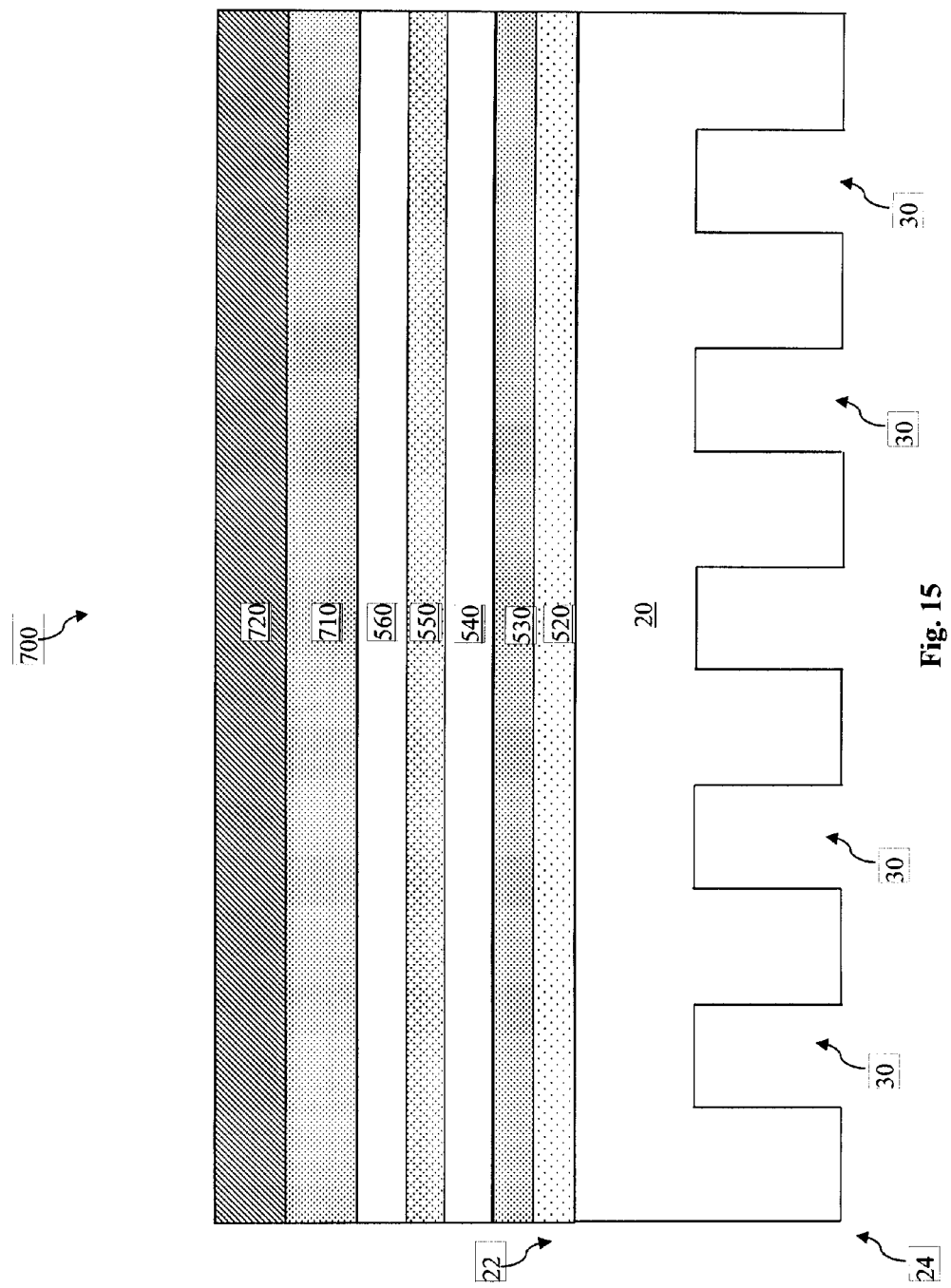
FIG. 15 is a diagrammatic fragmentary cross cross-sectional side view of an example high electron mobility transistor (HEMT) according to various aspects of the present disclosure.

The various layers of the LD 500 discussed above and shown in FIG. 14 are merely example layers. Other LDs may incorporate different layers depending on the design needs. In addition, other devices such as high electron mobility transistor (HEMT) devices may also benefit from the stress reduction by pre-cutting the back side of the silicon substrate, so that III-V compounds can be better grown on the front side of the silicon substrate. For the sake of providing an example, FIG. 15 shows a simplified cross-sectional view of an HEMT device 700. The HEMT device 700 shares some similar layers with the LD 500 discussed above. Therefore, similar layers are labeled the same for reasons of clarity and consistency.

Referring to FIG. 15, the HEMT device 700 includes a substrate 20, which is a silicon substrate in the embodiment shown. As discussed above, a plurality of recesses 30 are formed in the back side 24 of the silicon substrate 20 to reduce stress, so that III-V group compound layers can be grown on the front side 22 of the silicon substrate with reduced stress and reduced cracking.

A III-V group compound layer 520 is formed over the substrate 20 on the front side 22. In some embodiments, the III-V group compound layer 520 includes AlN. Another III-V group compound layer 530 is formed over the III-V group compound layer 20. In some embodiments, the III-V group compound layer 530 includes a plurality of sub-layers, for example AlGaN sub-layers. The thicknesses for these sub-layers may increase, and the aluminum content for these sub-layers may decrease, as the sub-layer go up (i.e., farther away from the substrate 20).

A III-V group compound epi layer 540 is then formed over the III-V group compound layer 530. In some embodiments, the III-V group compound epi layer 540 may include GaN. Thereafter, an AlN layer or an AlGaN layer 550 is formed over the III-V group compound epi layer 540. Another III-V group compound epi layer 560 is then formed over the AlN or AlGaN layer 550.

An un-doped III-V group compound layer 710 is formed on the III-V group compound epi layer 560. Thereafter, an aluminum gallium nitride ($Al_xGa_{1-x}N$) layer 720 is formed over the un-doped III-V group compound layer 710. In some embodiments, x is greater than 0 but less than 1. Additional processing may be needed to complete the fabrication of the HEMT device 700, but they are not discussed herein for reasons of simplicity.

Figure 16:
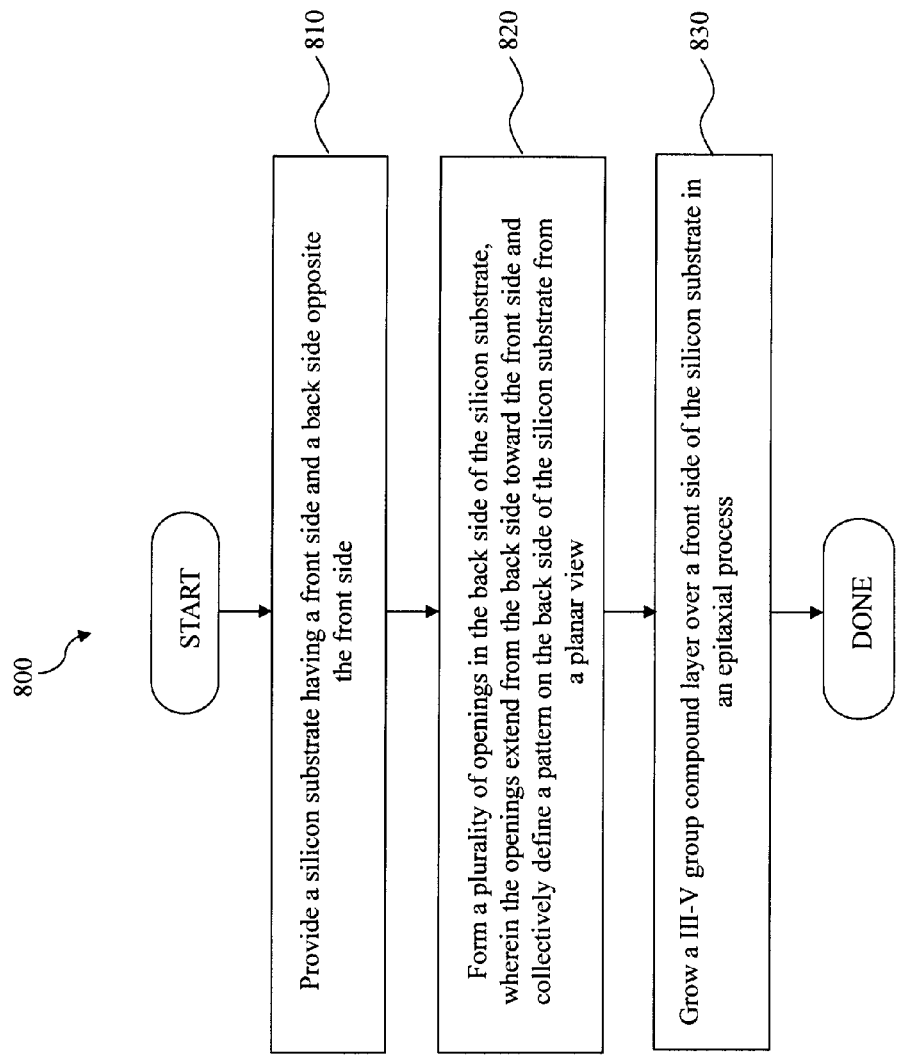
FIG. 16 is a flowchart illustrating a method of processing a substrate to improve the quality of one or more III-V group compound layer grown thereon according to various aspects of the present disclosure.

FIG. 16 is a flowchart illustrating a simplified method 800 of growing a high quality III-V group compound layer over a silicon substrate. The method 800 includes a step 810, in which a silicon substrate is provided. The silicon substrate has a front side and a back side opposite the front side.

The method 800 includes a step 820, in which a plurality of openings or recesses is formed in the back side of the silicon substrate. The openings extend from the back side toward the front side. The openings also collectively define a pattern on the back side of the silicon substrate from a planar view. In various embodiments, the pattern includes one of: a crisscrossing rectangles pattern, a crisscrossing triangles pattern, a concentric circles pattern, a multiple-holes pattern, a multiple-rods pattern, and a radial pattern. The step 820 in performed before the silicon substrate is loaded into an epitaxial growth chamber. In some embodiments, the openings are formed by an etching process. In some other embodiments, the openings are formed by a laser cutting process. In various embodiments, a thickness of a remaining portion of the silicon substrate having no openings is in a range from about 100 microns to about 300 microns. In some embodiments, a lateral dimension of each of the openings is in a range from about 10 microns to about 100 microns.

The method 800 includes a step 830, in which a III-V group compound layer is grown over the front side of the silicon substrate in an epitaxial growth process. In some embodiments, the III-V group compound layer is epitaxially grown directly on a surface of the silicon substrate from the front side. In various embodiments, the III-V group compound layer is a part of a LED, or a part of a LD, or a part of a HEMT. The LED, LD, HEMT may be formed over the front side of the silicon substrate and may each contain a plurality of other III-V group compound layers.

Additional processes may be performed before, during, or after the blocks 710-730 discussed herein to complete the fabrication of the photonic device. For example, in some embodiments, a cleaning process may be performed to the silicon substrate before the III-V group compound layer is grown. The cleaning process may include boiling the silicon substrate in a sulfuric acid ($H_2SO_4:H_2O_2$) solution; and thereafter dipping the silicon substrate in a hydrofluoric acid (HF) solution. Other additional processes are not discussed in detail herein for reasons of simplicity.

The embodiments of the present disclosure discussed above offer advantage over existing art. However, it is understood that not all advantages are necessarily described herein, other embodiments may offer different advantages, and that no particular advantage is required for all embodiments.

One of the advantages is that by precutting the silicon substrate from the back side, the recesses formed on the back side can effectively reduce the stress for the III-V group compounds grown on the front side of the silicon substrate. This is at least in part due to the fact that the recesses allow the substrate to better absorb stress (e.g., stress created during thermal processes) by expanding and contracting with the recesses as a buffer. In comparison, many traditional processes of forming III-V group compound layers on silicon use no cutting of the silicon substrate at all, which in turn leads to poor growth of the III-V group compound. In some cases, attempts have been made to pre-cut the silicon substrate from the front side. However, the drawbacks from such approach include difficult alignment issues for subsequent photolithography processes, a need to fabricate specific photomasks that cannot be readily adapted for use for other processes, and a probability of a melt back etching phenomenon due to the exposure of III-V compound materials during processing. These problems can all be avoided by the embodiments of the present disclosure, since the embodiments of the present disclosure involve pre-cutting the silicon substrate from its back side.

Another advantage of the present disclosure is that by pre-cutting the silicon substrate on the back side, it is easier to remove the silicon substrate by wet etching when the silicon substrate needs to be removed (for example in the case of the vertical LED shown in FIG. 11). This is at least in part due to the fact that the silicon substrate has a greater surface area and can come into contact with more etchant solutions, and also that the recesses in the silicon substrate entails that a smaller amount of silicon material needs to be removed.

Yet another advantage of the present disclosure is that it is compatible with standard fabrication processes, which saves fabrication time and reduces fabrication cost.

One aspect the present disclosure involves a device. The device includes: a silicon substrate having a first surface and a second surface opposite the first surface, wherein the silicon substrate contains a plurality of recesses that extend from the second surface toward the first surface, and wherein a distance from bottom surfaces of the recesses to the first surface of the silicon substrate is in a range from about 100 microns to about 300 microns; and a III-V group compound layer formed over the first surface of the silicon substrate.

In some embodiments, the III-V group compound layer is a part of one of: a light-emitting diode (LED), a laser diode (LD), and a high-electron mobility transistor (HEMT). In some embodiments, the device includes a lighting module that uses the LED as its light source.

In some embodiments, the III-V group compound layer is in direct contact with the first surface of the silicon substrate.

In some embodiments, the recesses have substantially similar shapes or sizes.

In some embodiments, the plurality of recesses are arranged so that the second surface of the substrate has a predefined pattern from a top view. In some embodiments, the predefined pattern is one of: a crisscrossing rectangles pattern, a crisscrossing triangles pattern, a concentric circles pattern, a multiple-holes pattern, a multiple-rods pattern, and a radial pattern.

In some embodiments, the recesses include elongate trenches each having a trench width from about 10 microns to about 100 microns.

Another one aspect the present disclosure involves an apparatus. The apparatus includes: a silicon substrate having a front side a back side opposite the front side, wherein the silicon substrate includes a plurality of openings formed from the back side of the silicon substrate, and wherein the openings collectively define a pattern on the back side of the silicon substrate from a planar view, and wherein portions of the silicon substrate vertically aligned with the openings have vertical dimensions that vary from about 100 microns to about 300 microns; and a III-V group compound layer formed over the front side of the silicon substrate, wherein the III-V group compound layer is a component of one of: a light-emitting diode (LED), a laser diode (LD), and a high-electron mobility transistor (HEMT).

In some embodiments, the III-V group compound layer comes into physical contact with the silicon substrate from the front side.

In some embodiments, the openings have substantially similar shapes or sizes.

In some embodiments, the pattern defined by the openings on the back side of the silicon substrate is one of: a crisscrossing rectangles pattern, a crisscrossing triangles pattern, a concentric circles pattern, a multiple-holes pattern, a multiple-rods pattern, and a radial pattern.

In some embodiments, the device includes a lighting module that uses the LED as its light source.

In some embodiments, the openings each have a horizontal dimension in a range from about 10 microns to about 100 microns.

Yet another one aspect the present disclosure involves a method of growing a III-V group compound material on a silicon substrate. The method includes: forming a plurality of openings in a back side of a silicon substrate, wherein the openings collectively define a pattern on the back side of the silicon substrate from a planar view; and thereafter growing a III-V group compound layer over a front side of the silicon substrate in an epitaxial process.

In some embodiments, the method further includes: forming one of: a light-emitting diode (LED), a laser diode (LD), and a high-electron mobility transistor (HEMT) over the front side of the silicon substrate, wherein the III-V group compound layer is a part of one of: the LED, the LD, and the HEMT.

In some embodiments, the growing the III-V group compound layer is performed so that the III-V group compound layer epitaxially grown directly on the front side of the silicon substrate. In some embodiments, the method further includes before the growing the III-V group compound layer: boiling the silicon substrate in a sulfuric acid ($H_2SO_4$:$H_2O_2$) solution; and thereafter dipping the silicon substrate in a hydrofluoric acid (HF) solution.

In some embodiments, the forming the plurality of openings comprises etching or laser cutting the openings into the silicon substrate in a manner such that a thickness of a remaining portion of the silicon substrate having no openings is in a range from about 100 microns to about 300 microns, and a lateral dimension of each of the openings is in a range from about 10 microns to about 100 microns.

In some embodiments, the pattern includes one of: a crisscrossing rectangles pattern, a crisscrossing triangles pattern, a concentric circles pattern, a multiple-holes pattern, a multiple-rods pattern, and a radial pattern.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A device, comprising:
    a substrate having a first surface and a second surface opposite the first surface, the substrate consisting of a silicon substrate, wherein the substrate contains a plurality of recesses that extend from the second surface toward the first surface, and wherein the plurality of recesses are arranged so that the second surface of the substrate has a predefined pattern from a top view;
    a lattice-buffer layer formed on the first surface of the substrate, the lattice-buffer layer containing a material that reduces a lattice mismatch between a III-V group compound material and the silicon substrate or the silicon carbide substrate; and
    a III-V group compound layer formed over the lattice-buffer layer, wherein the III-V group compound layer and the lattice-buffer layer have different material compositions.

2. The device of claim 1, wherein the III-V group compound layer is a part of one of: a light-emitting diode (LED), a laser diode (LD), and a high-electron mobility transistor (HEMT).

3. The device of claim 1, wherein the recesses have substantially identical shapes or sizes.

4. The device of claim 1, wherein the predefined pattern is one of: a crisscrossing rectangles pattern, a crisscrossing triangles pattern, a concentric circles pattern, a multiple-holes pattern, a multiple-rods pattern, and a radial pattern.

5. The device of claim 1, wherein the recesses include elongate trenches each having a trench width from about 10 microns to about 100 microns.

6. The device of claim 1, wherein the lattice-buffer layer contains at least one of: AlN and AlGaN.

7. The device of claim 1, wherein a distance from bottom surfaces of the recesses to the first surface of the substrate is in a range from about 100 microns to about 300 microns.

8. The device of claim 1, wherein the III-V group compound layer is a first III-V group compound layer and has a first type of conductivity, and wherein the device further comprises:
  a light-emitting layer disposed over the first III-V group compound layer;
  a second III-V group compound layer disposed over the light-emitting layer, the second III-V group compound layer having a second type of conductivity different from the first type;
  a first conductive contact disposed on the first III-V group compound layer; and
  a second conductive contact disposed on the second III-V group compound layer.

9. An apparatus, comprising:
  a silicon substrate having a front side a back side opposite the front side, wherein the silicon substrate consists of silicon and includes a plurality of openings formed from the back side of the silicon substrate, and wherein the openings collectively define a pattern on the back side of the silicon substrate from a planar view
  a lattice-buffer layer formed on the front side of the silicon substrate, the lattice-buffer layer containing a material that reduces a lattice mismatch between a III-V group compound material and the silicon substrate; and
  a III-V group compound layer containing the III-V group compound material formed over the front side of the silicon substrate, wherein the III-V group compound layer is a component of one of: a light-emitting diode (LED), a laser diode (LD), and a high-electron mobility transistor (HEMT).

10. The apparatus of claim 9, wherein the openings have substantially similar shapes or sizes.

11. The apparatus of claim 9, wherein the pattern defined by the openings on the back side of the silicon substrate is one of: a crisscrossing rectangles pattern, a crisscrossing triangles pattern, a concentric circles pattern, a multiple-holes pattern, a multiple-rods pattern, and a radial pattern.

12. The apparatus of claim 9, wherein the apparatus includes a lighting module that uses the LED as its light source.

13. The apparatus of claim 9, wherein the openings each have a horizontal dimension in a range from about 10 microns to about 100 microns.

14. The apparatus of claim 9, wherein the lattice-buffer layer contains at least one of: AlN and AlGaN.

15. The apparatus of claim 9, wherein portions of the silicon substrate vertically aligned with the openings have vertical dimensions that vary from about 100 microns to about 300 microns.

16. The apparatus of claim 9, wherein the III-V group compound layer is a first III-V group compound layer and has a first type of conductivity, and wherein the apparatus further comprises:
  a light-emitting layer disposed over the first III-V group compound layer;
  a second III-V group compound layer disposed over the light-emitting layer, the second III-V group compound layer having a second type of conductivity different from the first type;
  a first conductive contact disposed on the first III-V group compound layer; and
  a second conductive contact disposed on the second III-V group compound layer.

17. A device, comprising:
  a wafer having a front side a back side opposite the front side, the wafer consisting of a silicon wafer, wherein a plurality of trenches are formed in the back side of the wafer, the plurality of trenches collectively defining a pattern on the back side of the wafer from a planar view;
  a lattice-buffer layer disposed on the front side of the wafer, the lattice-buffer layer containing a material that reduces a lattice mismatch between a III-V group compound material and silicon or silicon carbide;
  a first doped III-V group compound layer disposed over the lattice-buffer layer;
  a light-emitting layer disposed over the first doped III-V group compound layer;
  a second doped III-V group compound layer disposed over the light-emitting layer, wherein the first and second doped III-V group compound layers have different types of conductivity;
  a first contact disposed over the first doped III-V group compound layer; and
  a second contact disposed over the second doped III-V group compound layer.

18. The device of claim 17, wherein the pattern is one of: a crisscrossing rectangles pattern, a crisscrossing triangles pattern, a concentric circles pattern, a multiple-holes pattern, a multiple-rods pattern, and a radial pattern.

19. The device of claim 17, wherein the trenches each have a trench width in a range from about 10 microns to about 100 microns.

20. The device of claim 17, wherein portions of the wafer aligned with the trenches have a thickness in a range from about 100 microns to about 300 microns.

* * * * *